(12) United States Patent
Shinozaki

(10) Patent No.: US 6,462,993 B2
(45) Date of Patent: Oct. 8, 2002

(54) SEMICONDUCTOR INTEGRATED CIRCUIT

(75) Inventor: Naoharu Shinozaki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/839,306

(22) Filed: Apr. 23, 2001

(65) Prior Publication Data

US 2001/0035537 A1 Nov. 1, 2001

(30) Foreign Application Priority Data

Apr. 27, 2000 (JP) ........................................ 2000-127261

(51) Int. Cl.[7] ................................................. G11C 7/00
(52) U.S. Cl. .................... 365/200; 365/230.08; 365/233
(58) Field of Search ........................... 365/200, 230.08, 365/233, 225.7, 189.05, 189.07

(56) References Cited

U.S. PATENT DOCUMENTS 5,835,424 A * 11/1998 Kikukawa et al. .......... 365/200
6,188,620 B1 * 2/2001 Shibuya ...................... 365/200

* cited by examiner

*Primary Examiner*—David Lam
(74) *Attorney, Agent, or Firm*—Arent Fox Kintner Plotkin & Kahn

(57) ABSTRACT

An address input circuit outputs an address signal from exterior as an internal address signal. A latching circuit accepts the internal address signal, and supplies the accepted signal to an internal circuit in conformity to the operating timing of the internal circuit. A redundancy judgement circuit judges whether or not the internal address signal yet to be accepted into the latching circuit is of a defect address, and outputs the judgement result as a redundancy judgement signal. A redundancy latching circuit accepts the redundancy judgement signal, and supplies the accepted signal to the internal circuit in conformity to the operating timing of the internal circuit. The use of the address signal before it is latched for redundancy judgement allows the redundancy judgement to be performed at earlier timing. Therefore, the amount of time needed for the read operation and write operation can be reduced.

6 Claims, 10 Drawing Sheets

SEMICONDUCTOR INTEGRATED CIRCUIT

BACKGROUND OF THE INVENTION

1. Field of the Invention

The present invention relates to a semiconductor integrated circuit having memory cells. In particular, the present invention relates to a semiconductor integrated circuit having a redundancy circuit for relieving a defect in a memory cell or a defect in a peripheral circuit thereof.

2. Description of the Related Art

In general, semiconductor integrated circuits such as a DRAM have redundancy circuits so that lattice defects in their substrates and other defects resulting from particles produced in fabrication processes are relieved for an improved yield.

FIG. 1 shows the essential parts of a DRAM that has a redundancy circuit of this type. In the diagram, thick lines represent signal lines including a plurality of lines each.

The DRAM has an input circuit 2, a command decoder 4, an input buffer 6 for receiving a clock signal CLK, an address input circuit 8 for receiving an address signal ADD, a latching circuit 10, a predecoder 12, a column decoder 14, a fuse circuit 16, a redundancy judgement circuit 18, a redundancy predecoder 20, and a redundancy column decoder 22. The predecoder 12, column decoder 14, fuse circuit 16, redundancy judgement circuit 18, redundancy predecoder 20, and redundancy column decode 22 are circuits that operate in response to a supply of a column address. That is, this DRAM has a redundancy circuit for relieving a defect associated with a column address.

The input circuit 2 has an input buffer 2a for receiving command signals /CS, /RAS, /CAS, and /WE (hereinafter, these signals are collectively referred to as a command signal CMD), and a latch 2b for accepting the received signals in synchronization with an internal clock signal CLKINZ which is output from the input buffer 6. The command decoder 4 decodes the accepted command signal, and outputs command signals ACTV, READ, and WRITE, as well as an RAS address latching signal ERALPZ and a CAS address latching signal EXTPZ, depending on the decoding result.

The address input circuit 8 has an input buffer 8a for receiving the address signal ADD, and a latch 8b for accepting the received signal in synchronization with the internal clock signal CLKINZ. The latch 8b outputs the accepted signal as an internal address signal ADDIN. Incidentally, the DRAM of this example employs an address multiplex method, in which a row address or a column address is supplied to the DRAM as the address signal ADD.

The latching circuit 10 has a row latch 10a and a column latch 10b. The row latch 10a accepts a row address in synchronization with the RAS address latching signal ERALPZ, and outputs the accepted signal as a row address signal RADD. The row address signal RADD is supplied to not shown circuits associated with row addresses. The column latch 10b accepts a column address in synchronization with the CAS address latching signal EXTPZ, and outputs the accepted signal as a column address signal CADD.

The predecoder 12 accepts, when a redundancy judgement signal RDN is inactivated (at low level), the column address signal CADD in synchronization with a column enable pulse CEP which is generated by a not-shown control circuit. The predecoder 12 decodes the accepted signal to output a predetermined predecoding signal PDEC. The column decoder 14 decodes the predecoding signal PDEC, and activates a predetermined column line selecting signal CL.

The fuse circuit 16 includes a plurality of fuses formed of polysilicon or the like, and a control circuit thereof. The fuses are blown depending on a defect address (column address) found in a probe test under a wafer state. The fuse circuit 16 outputs the defect address set by the fuse blowing, as a redundancy column address signal RCADD. The redundancy judgement circuit 18 compares the column address signal CADD and the redundancy column address signal RCADD, and if these signals coincide with each other, activates (to high level) the redundancy judgement signal RDN.

The redundancy predecoder 20 accepts the redundancy judgement signal RDN in synchronization with the column enable pulse CEP, and outputs the accepted signal as a redundancy predecoding signal RPDEC. The redundancy column decoder 22 receives the redundancy predecoding signal RPDEC, and activates a redundancy column line selecting signal RCL The redundancy column line selecting signal RCL is activated when the comparison between the address signals CADD and RCADD in the redundancy judgement circuit 18 shows a coincidence. Then, the redundancy circuit operates to perform a read operation or a write operation on a not shown redundancy memory cell.

FIG. 2 shows an example of read operations by the DRAM shown in FIG. 1.

For a start, the command signal CMD (active command ACTV) and the address signal ADD (row address R1) are supplied to the DRAM in synchronization with the clock signal CLK. The latch 2b shown in FIG. 1 accepts the command signal CMD in synchronization with the internal clock signal CLKINZ (FIG. 2(a)). The latch 8b accepts the row address R1 in synchronization with the internal clock signal CLKINZ, and outputs the accepted address as the internal address signal ADDIN (FIG. 2(b)). Thereafter, a word line (not shown) corresponding to the row address R1 is selected.

In synchronization with the next clock signal CLK, the command signal CMD (read command READ) and the address signal ADD (column address C1) are supplied to the DRAM. Here, the column address C1 is an address corresponding to the location where a defect lies. Its information is written in the fuse circuit 16. The latch 8b accepts the column address C1 in synchronization with the internal clock signal CLKINZ, and outputs the accepted address as the internal address signal ADDIN (FIG. 2(c)).

The command decoder 4 receives the read command READ, and then turns the CAS address latching signal EXTPZ to high level after a predetermined period of time. The latch 10b accepts the column address C1 in synchronization with the rising edge of the CAS address latching signal EXTPZ, and outputs the accepted address as the column address signal CADD (FIG. 2(d)). The column address signal CADD is supplied to the predecoder 12 and the redundancy judgement circuit 18. The column address signal CADD (column address C1) coincides with the redundancy column address signal RCADD from the fuse circuit 16. Thus, the redundancy judgement circuit 18 turns the redundancy judgement signal RDN to high level (FIG. 2(e)). Here, the time T1 that elapses from the change of the column address signal CADD to the activation of the redundancy judgement signal RDN is the period necessary for the redundancy judgement circuit 18 to perform the redundancy judgement.

The activation of the redundancy judgement signal RDN inactivates the predecoder 12. The inactivation of the predecoder 12 disables operations on the normal memory cell corresponding to the column address C1. The redundancy predecoder 20 accepts the redundancy judgement signal RDN in synchronization with the rising edge of the column enable pulse CEP, and outputs the redundancy predecoding signal RPDEC (FIG. 2(f)). The redundancy column decoder 22 receives the redundancy predecoding signal RPDEC, and activates (to high level) the redundancy column line selecting signal RCL (FIG. 2(g)). The activation of the redundancy column line selecting signal RCL brings into conduction a column switch that is formed as the redundancy circuit. Thereby, data read from the redundancy memory cell (not shown) is output.

In synchronization with the next clock signal CLK, the command signal CMD (read command READ) and the address signal ADD (column address C2) are supplied to the DRAM. Here, the column address C2 is not an address corresponding to the defective portion. Therefore, the redundancy judgement circuit 18 turns the redundancy judgement signal RDN to low level (FIG. 2(h)).

The predecoder 12 is activated by the inactivation of the redundancy judgement signal RDN. The redundancy column decoder 22 is inactivated by the inactivation of the redundancy judgement signal RDN. The inactivation of the redundancy column decoder 22 disables operations on the redundancy memory cell. The predecoder 12 accepts the column address signal CADD in synchronization with the rising edge of the column enable pulse CEP, decodes the accepted signal, and outputs a predetermined predecoding signal PDEC (FIG. 2(i)).

The column decoder 14 decodes the predecoding signal PDEC, and activates (to high level) a predetermined column line selecting signal CL (FIG. 2(j)). The activation of the column line selecting signal CL brings a predetermined column switch into conduction, whereby data read from the memory cell (not shown) is output.

In the conventional DRAM described above, the inputting of an address, the latching, the redundancy judgement, and the decoding are executed in succession to their respective preceding processes. For example, the redundancy judgement circuit 18 receives the column address signal CADD generated through the address input circuit 8 and the latching circuit 10. In other words, the address comparison in the redundancy judgement circuit 18 is performed after the generation of the column address signal CADD. On this account, there has been a problem that the operating timing of the internal circuits lags as much as the time T1 mentioned above, thereby delaying the output of read data. That is, the access time cannot be reduced. This problem also occurs in write operations. More specifically, the write timing of write data into a memory cell lags as much as the time T1 which is necessary for a comparison between the write address and the defect address. The increased read operation time and write operation time prevent the clock signal being enhanced in frequency.

SUMMARY OF THE INVENTION

An object of the present invention is to reduce the amount of access times of a semiconductor integrated circuit which has memory cells and a redundancy circuit for relieving a defect.

Another object of the present invention is to perform redundancy judgement in the redundancy circuit at a earlier timing, thereby avoiding unnecessary operations of internal circuits, and reducing power consumption.

Still another object of the present invention is to make the operating timing of internal circuits equal regardless of addresses being normal or defective, thereby facilitating controlling the internal circuits.

Another object of the present invention is to provide a clock synchronous type semiconductor integrated circuit having memory cells, wherein read and write operations on a memory cell or a redundancy memory cell are controlled at higher speed, thereby heightening the frequency of a clock signal.

Another object of the present invention is to provide a semiconductor integrated circuit including memory cells to which row address signals and column address signals are sequentially supplied, wherein the redundancy judgement of the row address signal or the column address signal is performed at high speed.

According to one aspect of the present invention, a semiconductor integrated circuit includes memory cells, a redundancy memory cell for relieving a defect, an address input circuit, a latching circuit, a redundancy judgement circuit, and a redundancy latching circuit. The address input circuit receives an address signal supplied from the exterior, and outputs the received signal as an internal address signal. The latching circuit accepts the internal address signal from the address input circuit, and supplies the accepted signal to an internal circuit in conformity to the operating timing of the internal circuit. The redundancy judgement circuit receives the internal address signal from the address input circuit, judges whether or not the internal address signal received is of a defect address, and outputs the judgement result as a redundancy judgement signal. That is, the redundancy judgement signal is activated when the internal address signal is of a defect address. The redundancy latching circuit accepts the redundancy judgement signal, and supplies the accepted signal to the internal circuit in conformity to the operating timing of the internal circuit. Since the address signal before it is latched is thus used for the redundancy judgement, the redundancy judgement can be performed at a earlier timing. The redundancy judgement signal (the information of the redundancy address) can be latched after the redundancy judgement. This allows reduction in the amount of time needed for performing the read operation and the write operation to the memory cells or the redundancy memory cell. Moreover, since the redundancy judgement is performed at a early point in time during the operating cycle, access to normal memory cells can be disabled earlier in relieving a defect (when the redundancy judgement signal is activated). As a result, unnecessary operations of internal circuits associated with memory cell operations can be avoided thereby reducing power consumption.

According to another aspect of the present invention, the address input circuit outputs the received address signal initially as a first internal address signal, and then as a second internal address signal which is behind the first internal address signal in timing. For example, the time the second internal address signal is delayed compared to the first internal address signal is set to correspond to the time for the redundancy judgement circuit to make a defect address judgement. The redundancy judgement circuit receives the first internal address signal as the internal address signal. The latching circuit receives the second internal address signal as the internal address signal. This makes it possible to make the latching timing of the latching circuit equal to that of the redundancy latching circuit. Therefore, the operating timings of the internal circuit can be equalized irrespective of addresses being normal or defective. As a result, controlling the internal circuit is facilitated.

According to another aspect of the present invention, the address input circuit outputs the first internal address signal and the second internal address signal in synchronization with a clock signal supplied from exterior. Alternatively, the address input circuit outputs the first internal address signal not in synchronization, or in asynchronization, with a clock signal supplied from exterior, and outputs the second internal address signal in synchronization with the clock signal. Therefore, even in a semiconductor integrated circuit of clock synchronous type, read and write operations on a memory cell or a redundancy memory cell can be controlled at high speed. As a result, it becomes possible to heighten the frequency of the clock signal.

According to another aspect of the present invention, a read operation, a write operation, or the like is performed in accordance with an address signal that is successively supplied in twice. Here, the redundancy judgement circuit judges whether or not the address signal received first is of a defect address. Therefore, for example, in a semiconductor integrated circuit to which a row address signal and a column address signal are sequentially supplied, the redundancy judgement of the row address signal can be performed at high speed.

According to another aspect of the present invention, a read operation, a write operation, or the like is performed in accordance with an address signal that is successively supplied in twice. Here, the redundancy judgement circuit judges whether or not the address signal received second is of a defect address. Therefore, for example, in a semiconductor integrated circuit to which a row address signal and a column address signal are sequentially supplied, the redundancy judgement of the column address signal can be performed at high speed.

BRIEF DESCRIPTION OF THE DRAWINGS

The nature, principle, and utility of the invention will become more apparent form the following detailed description when read in conjunction with the accompanying drawings in which like parts are designated by identical reference numbers, in which.

DESCRIPTION OF THE PREFERRED EMBODIMENTS

Hereinafter, embodiments of the present invention will be described with reference to the drawings.

Figure 1:
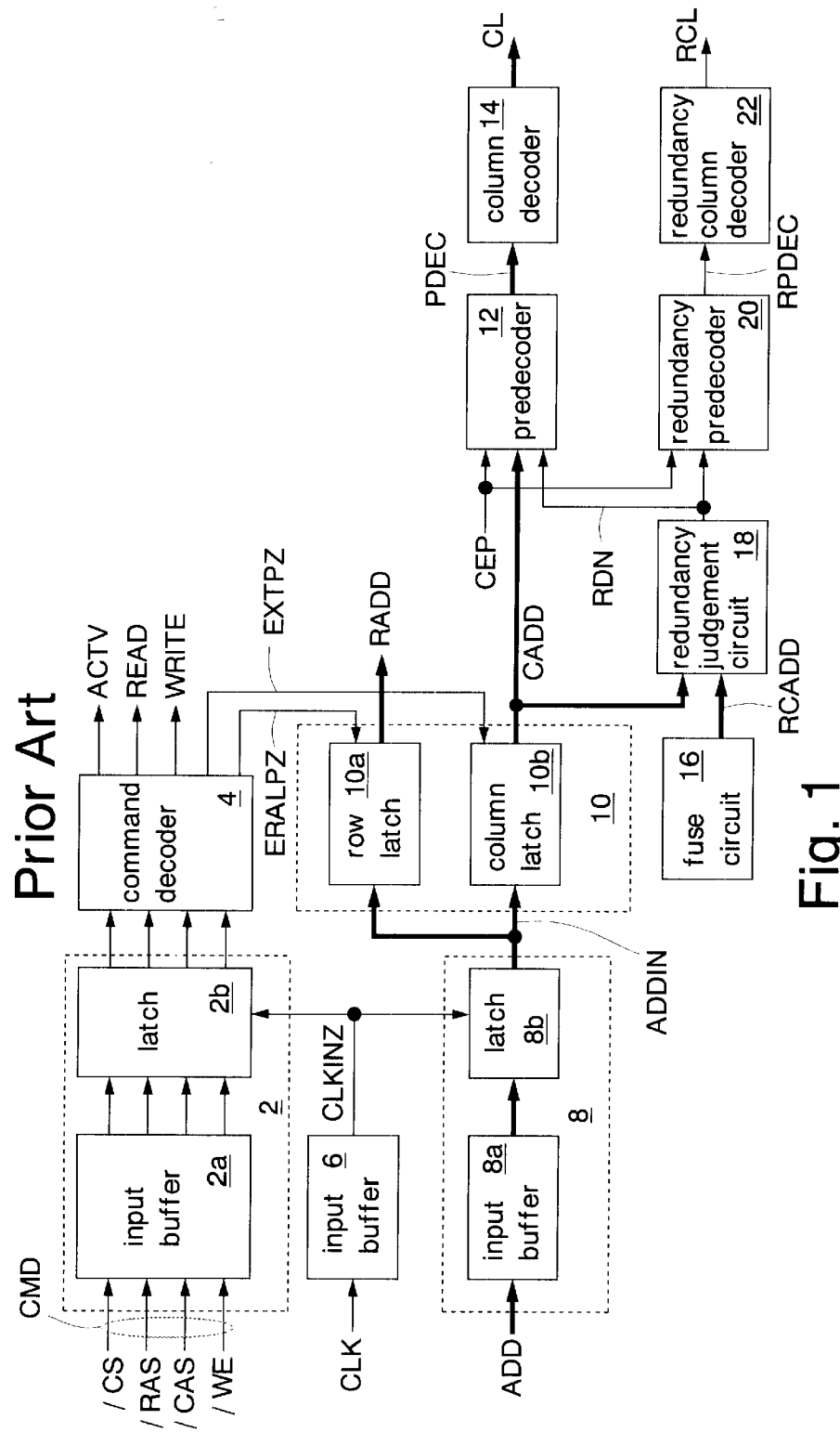
FIG. 1 is a block diagram showing a conventional semiconductor integrated circuit.
Figure 2:
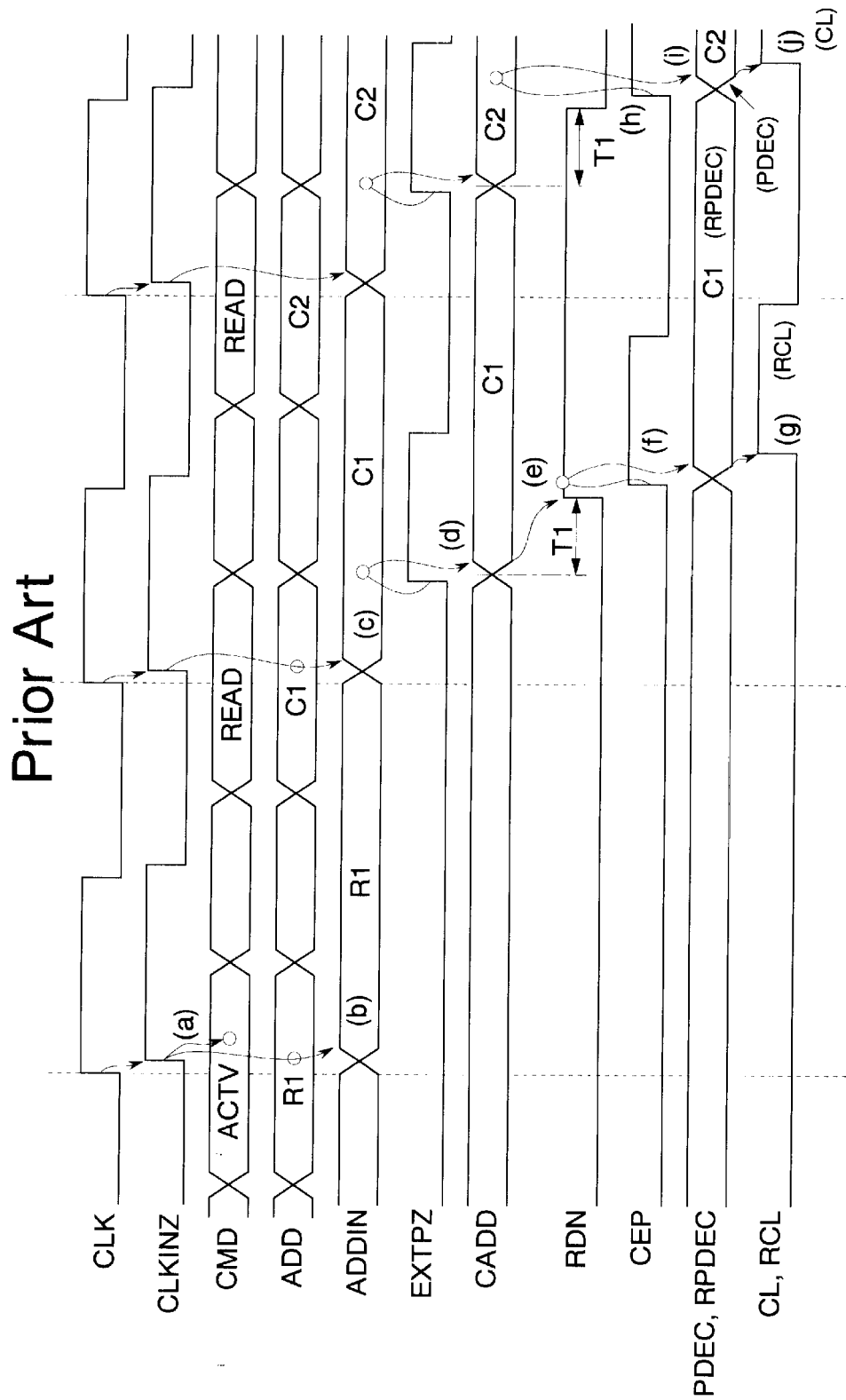
FIG. 2 is a timing chart showing the read operations of the conventional semiconductor integrated circuit.
Figure 3:
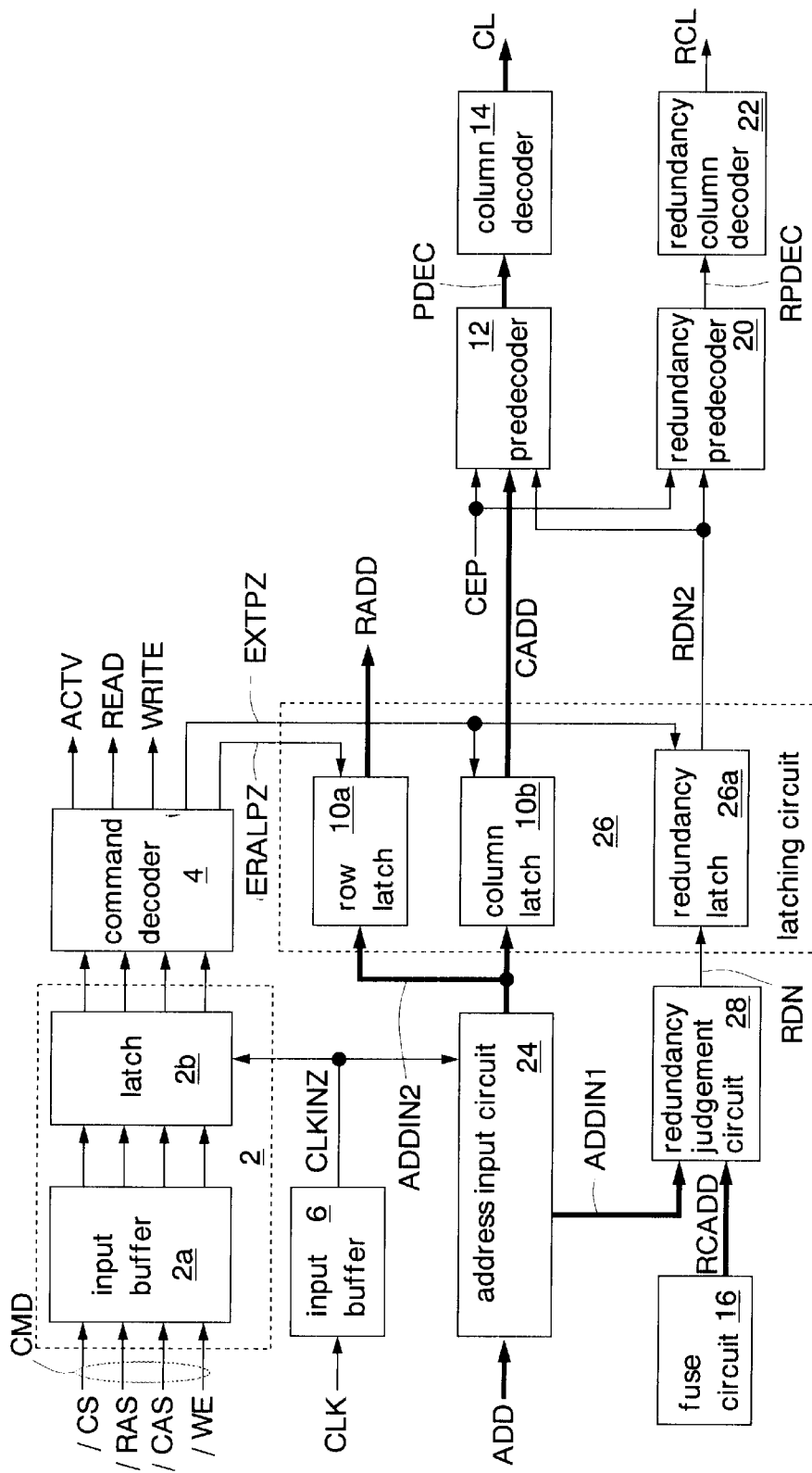
FIG. 3 is a block diagram showing a first embodiment of the semiconductor integrated circuit in the present invention.

FIG. 3 shows a first embodiment of the semiconductor integrated circuit in the present invention. The same circuits and signals as those described in the conventional art will be designated by identical reference numbers. Detailed description thereof will be omitted.

This semiconductor integrated circuit is formed as an FCRAM (Fast Cycle RAM) with an SDRAM interface, on a silicon substrate by using CMOS processes. That is, this FCRAM receives an address signal ADD in the form of a row address signal and a column address signal successively (address multiplex method), selects a word line corresponding to the row address signal, and performs a read operation or write operation in accordance with the column address signal.

The FCRAM has an input circuit 2, a command decoder 4, an input buffer 6 for receiving a clock signal CLK, an address input circuit 24 for receiving the address signal ADD, a latching circuit 26, a predecoder 12, a column decoder 14, a fuse circuit 16, a redundancy judgement circuit 28, a redundancy predecoder 20, and a redundancy column decoder 22. The input circuit 2, command decoder 4, input buffer 6, predecoder 12, column decoder 14, fuse circuit 16, redundancy predecoder 20, and redundancy column decoder 22 are identical to the conventional ones. The connections of these circuits are also identical.

In an actual FCRAM, a plurality of redundancy judgement circuits 28 and redundancy latches 26a are formed to relieve a plurality of defects. This embodiment omits these circuits for the sake of simplicity.

Figure 4:
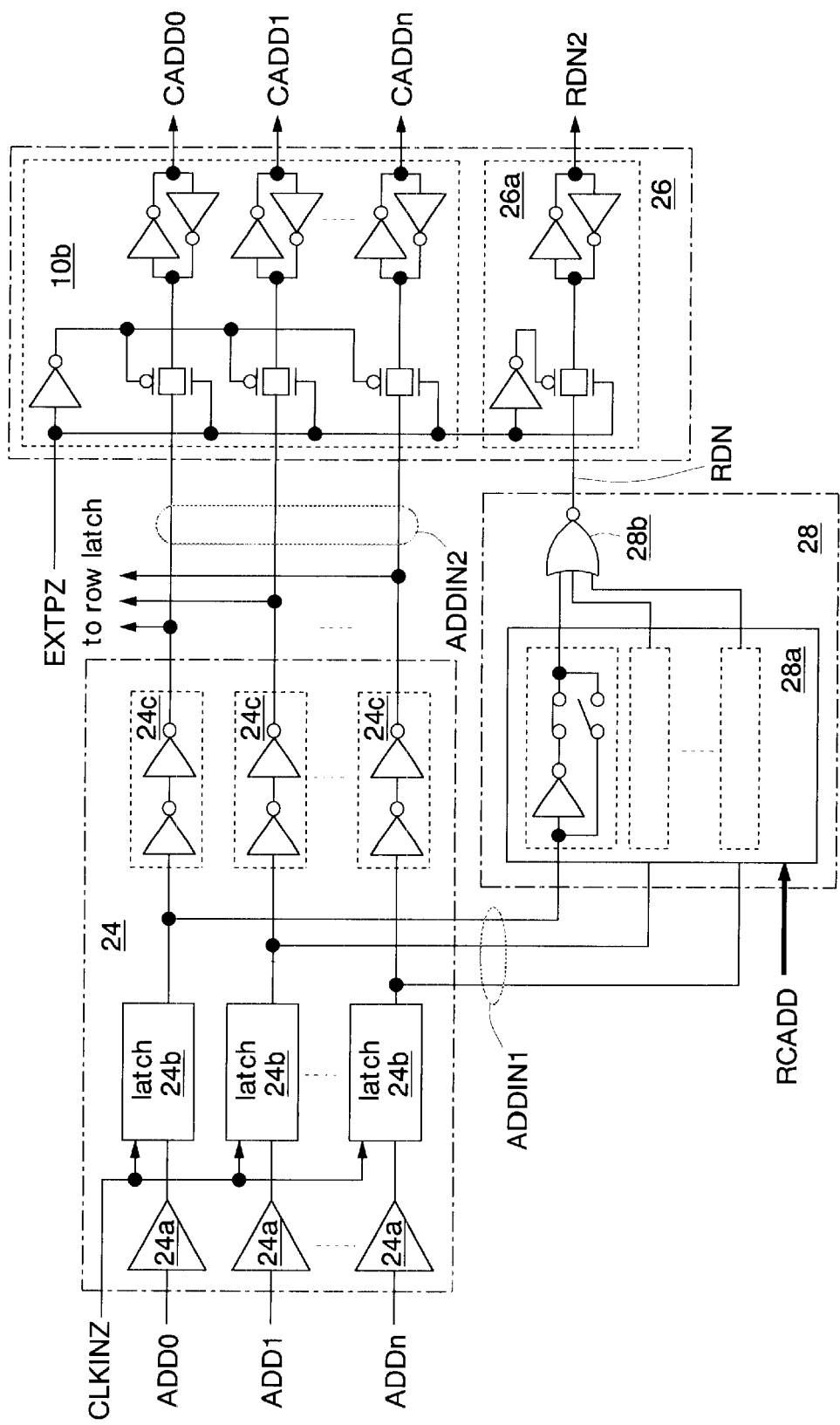
FIG. 4 is a circuit diagram showing the essential parts of FIG. 3.

FIG. 4 shows the details of the address input circuit 24, the redundancy judgement circuit 28, and the latching circuit 26.

The address input circuit 24 has input buffers 24a including current mirror circuits, latches 24b including differential amplifiers, and buffers 24c so as to correspond to address signals ADD0–ADDn. Incidentally, the input buffers 24a are not limited to the current mirror circuits, and may have, e.g., gating circuits such as inverters. The latches 24b accept the output signals from the input buffers 24a in synchronization with the internal clock signal CLKINZ, and output the accepted signals as a first internal address signal ADDIN1. The buffers 24c receive the first internal address signal ADDIN1, delay the received signal by predetermined time, and output as a second internal address signal ADDIN2. The delay times of the buffers 24c are set to be approximately equal to the time required for the redundancy judgement in the redundancy judgement circuit 28 to be described next.

The redundancy judgement circuit 28 has comparison parts 28a for comparing the individual bits of the first internal address signal ADDIN1 with a redundancy column address signal RCADD output from the fuse circuit 16, and a judgement part 28b for activating a redundancy judgement signal RDN in accordance with the comparison results from the comparison parts 28a. The comparison part 28a is a circuit for outputting either the first internal address signal ADDIN1 or the inverted signal of the first internal address signal ADDIN1, depending on the redundancy column address signal RCADD. The comparison parts 28a can be composed of ENOR circuits, for example. The judgement part 28b includes, e.g., a NOR gate. The redundancy judgement signal RDN is activated (to high level) when all the comparison parts 28a output low level.

The latching circuit 26 has the row latch 10a and column latch 10b, as well as a redundancy latch 26a shown in FIG. 3. The column latch 10b has a plurality of CMOS transmission gates for transmitting the second internal address signal ADDIN2 to the interior upon the activation of a CAS address latching signal EXTPZ, and a plurality of latches for latching the second internal address signal ADDIN2 transmitted through these CMOS transmission gates and outputting the latched signal as column address signals CADD0–CADDn. The redundancy latch 26a has a CMOS transmission gate for transmitting the redundancy judgement signal RDN to the interior upon the activation of the CAS address latching signal EXTPZ, and a latch for latching the redundancy judgement signal RDN transmitted through this CMOS transmission gate and outputting the latched signal as a redundancy judgement signal RDN2.

Figure 5:
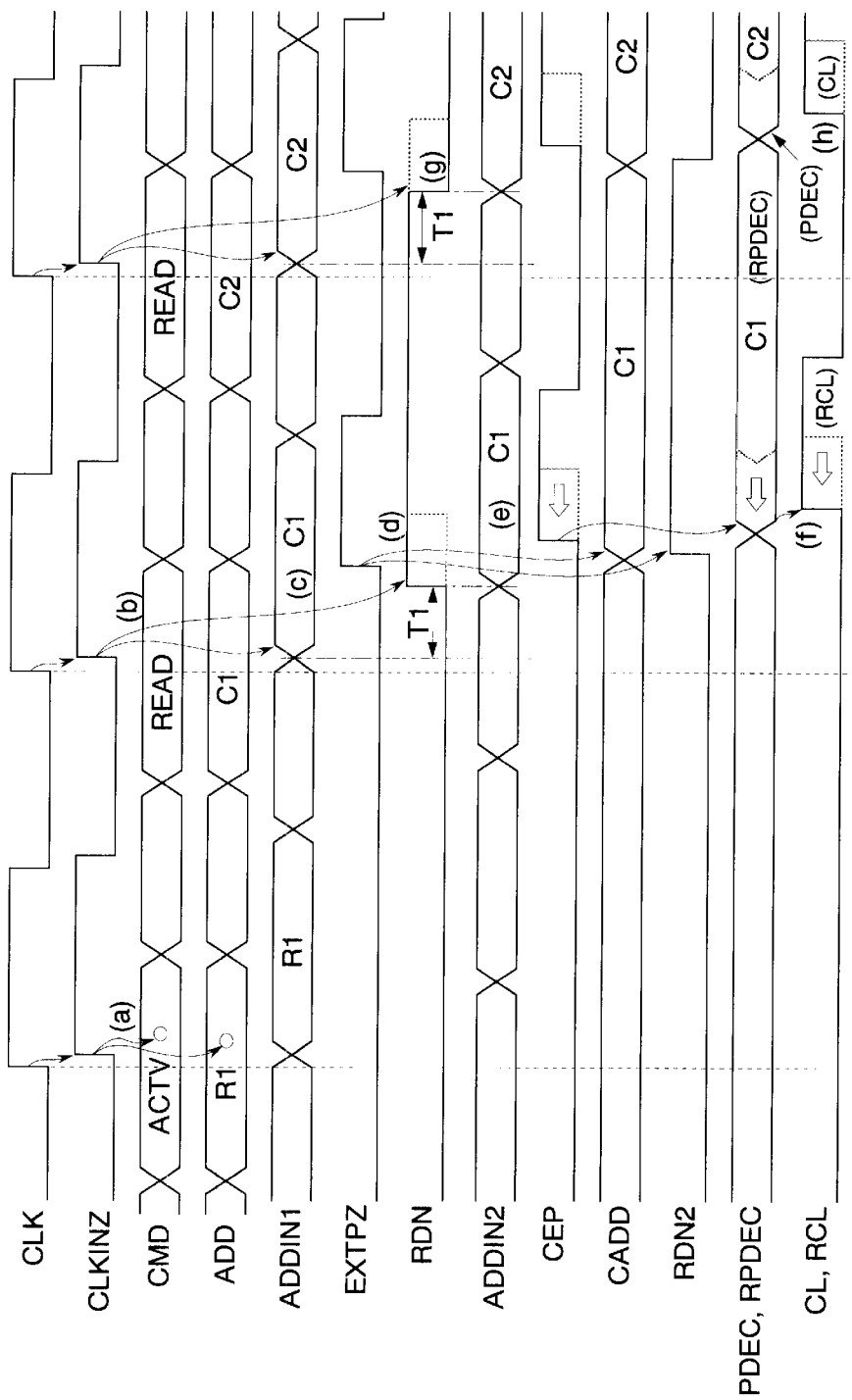
FIG. 5 is a timing chart showing the read operations of the semiconductor integrated circuit in FIG. 3.

FIG. 5 shows an example of read operations by the FCRAM shown in FIG. 3. Here, description will be omitted of the same operations as the conventional ones.

Initially, as in conventional art, an active command ACTV and a row address R1 are supplied to the FCRAM in synchronization with the clock signal CLK (FIG. 5(a)). Thereby, a word line (not shown) corresponding to the row address R1 is selected.

Next, a read command READ and a column address C1 (defect address) are supplied to the FCRAM in synchronization with the clock signal CLK-(FIG. 5(b)).

The latches 24b in the address input circuit 24 shown in FIG. 4 accept the column address C1 amplified by the input buffers 24a, in synchronization with the internal clock signal CLKINZ. The latches 24b output the accepted address as the first internal address signal ADDIN1 (FIG. 5(c)). The redundancy judgement circuit 28 compares the first internal address signal ADDIN1 and the redundancy column address signal RCADD, and activates (to high level) the redundancy judgement signal RDN upon the coincidence of these signals (FIG. 5(d)). The activation of the redundancy judgement signal RDN inactivates the predecoder 12. The inactivation of the predecoder 12 disables operations on the normal memory cell corresponding to the column address C1. The buffers 24c in the address input circuit 24 output the second internal address signal ADDIN2, which is the first internal address signal ADDIN1 delayed by time T1 (FIG. 5(e)). The time T1 is equal to the time required for the redundancy judgement in the redundancy judgement circuit 28. Therefore, the output timing of the second internal address signal ADDIN2 coincides with the activation timing of the redundancy judgement signal RDN.

The redundancy latching circuit 26a accepts the redundancy judgement signal RDN in synchronization with the CAS address latching signal EXTPZ. Subsequently, the redundancy predecoder 20 and the redundancy column decoder 22 operate as in conventional art, thereby activating (to high level) a redundancy column line selecting signal RCL (FIG. 5(f)). Then, a column switch formed as the redundancy circuit turns on, whereby data read from the redundancy memory cell (not shown) is output. Note that the broken lines in the chart show the conventional timing.

The redundancy judgement (time T1) by the redundancy judgement circuit 28 is performed in advance of the latching timing indicated by the CAS address latching signal EXTPZ of the latching circuit 26. In other words, the redundancy judgement is performed not in synchronization with the CAS address latching signal EXTPZ. Since the redundancy judgement is performed at an earlier time of a read cycle, the subsequent address decoding is started earlier. As a result, the access time to the redundancy memory cell is reduced.

Next, the read command READ and a column address C2 are supplied to the FCRAM in synchronization with the clock signal CLK. This column address C2 is not a defect address. Therefore, the redundancy judgement circuit 28 turns the redundancy judgement signal RDN to low level (FIG. 5(g)). Here, the inactivation timing of the redundancy judgement signal RDN becomes also earlier than heretofore. The predecoder 12 is activated by the inactivation of the redundancy judgement signal RDN. The redundancy column decoder 22 is inactivated by the inactivation of the redundancy judgement signal RDN. The inactivation of the redundancy column decoder 22 disables operations on the redundancy memory cell. Then, the predecoder 12 and the column decoder 14 operate to activate (to high level) a column line selecting signal CL (FIG. 5(h)). The activation of the column line selecting signal CL brings a predetermined column switch into conduction, whereby data read from the memory cell (not shown) is output. Since the redundancy judgement is thus performed earlier, the operations of the circuits corresponding to column addresses are started earlier even for normal addresses. As a result, the access time to normal memory cells is also reduced.

Incidentally, though not particularly shown in timing charts, the access time in a write operation can also be reduced as in a read operation. In this case, the redundancy judgement circuit 28 judges whether or not the write address is a defect address.

As has been described, in the semiconductor integrated circuit of the present invention, the first internal address signal ADDIN1 before the latching into the latching circuit 26 is used for redundancy judgement. Therefore, the redundancy judgement can be performed at an earlier time of an operating cycle. This allows a reduction of the read operation time and write operation time to a memory cell or the redundancy memory cell.

Since the redundancy judgement is performed at an earlier time of an operating cycle, the access to a normal memory cell can be disabled earlier in relieving a defect (when the redundancy judgement signal RDN is activated). As a result, unnecessary operations of internal circuits associated with memory cell operations can be avoided for reduced power consumption.

The address input circuit outputs the first internal address signal ADDIN1 which is used for the redundancy judgement, and the second internal address signal ADDIN2 which lags behind the first internal address signal ADDIN1 by the time T1 and is used as a normal column address. The time T1 is the time for the redundancy judgement circuit 28 to make a defect address judgement. This can make the latching timing of the column latch 10b and the latching timing of the redundancy latch 26a coincide with each other. Therefore, the operating timing of the internal circuits can be rendered identical irrespective of normal/redundancy addresses. As a result, the control of the internal circuits is facilitated.

The address input circuit accepts the address signal ADD in synchronization with the clock signal CLK supplied from exterior, and outputs the accepted signal as the first internal address signal ADDIN1 and the second internal address signal ADDIN2. Therefore, even in the semiconductor memory of clock synchronous type, read operations and write operations to a memory cell or a redundancy memory cell can be controlled at high speed. As a result, it becomes possible to enhance the frequency of the clock signal CLK.

The redundancy judgement circuit 28 judges whether or not the column address C1, supplied along with the read command READ, is a defect address. Therefore, in the semiconductor memory to which a row address signal and a column address signal are supplied in succession, the redundancy judgement on the row address signal can be performed at high speed.

Figure 6:
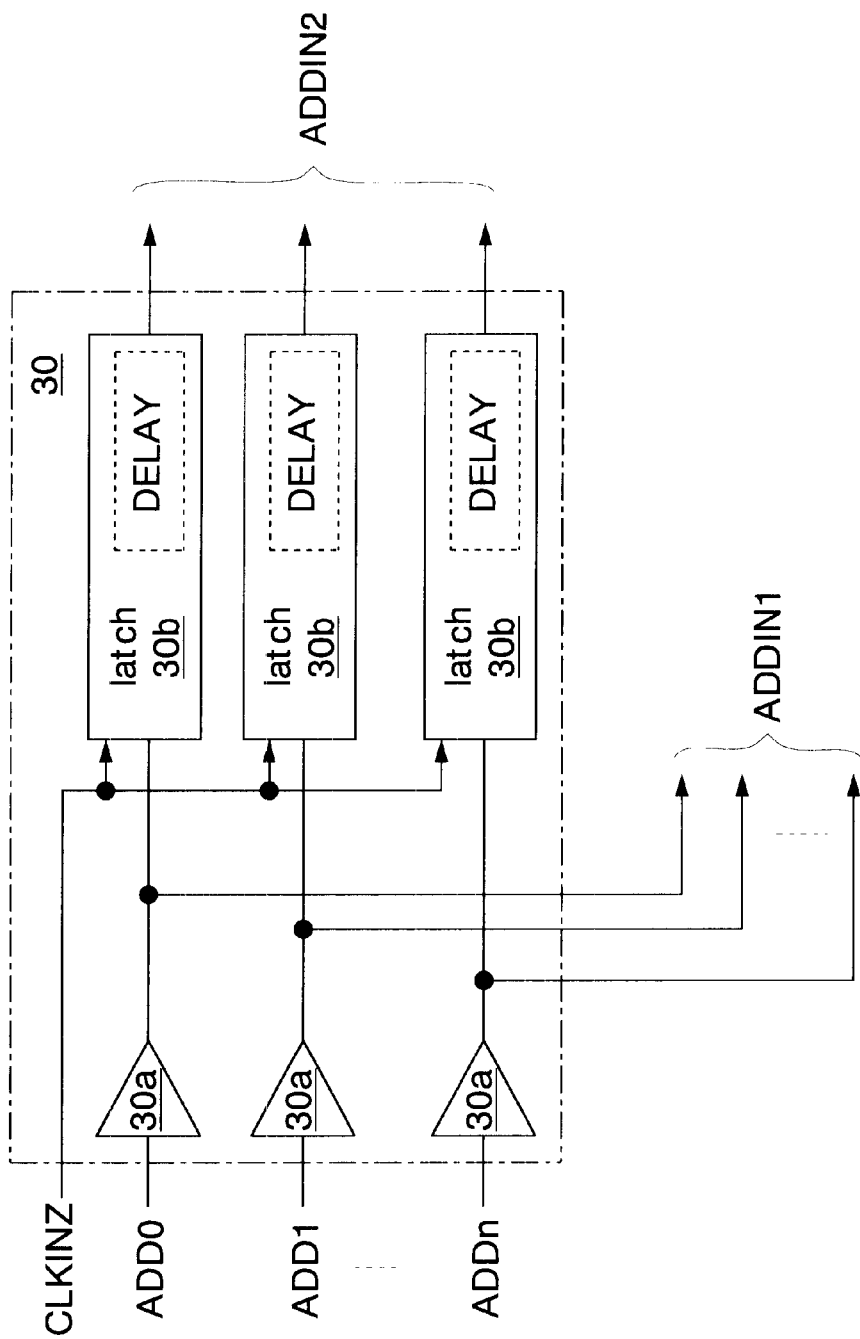
FIG. 6 is a block diagram showing the essential parts of a second embodiment of the semiconductor integrated circuit in the present invention.

FIG. 6 shows an address input circuit in a second embodiment of the semiconductor integrated circuit in the present invention. The same circuits and signals as those described in the conventional art and in the first embodiment will be designated by identical reference numbers. Detailed description thereof will be omitted.

The semiconductor integrated circuit of this embodiment is formed as an FCRAM similar to that of the first embodiment. The FCRAM has an address input circuit 30 which differs from the address input circuit 24 of the first embodiment. The configuration excepting the address input circuit 30 is substantially identical to that of the first embodiment.

The address input circuit 30 has input buffers 30a including current mirror circuits, and latches 30b so as to correspond to address signals ADD0–ADDn. The input buffers 30a amplify the address signals ADD0–ADDn, and output the amplified signals as a first internal address signal ADDIN1. Since the first internal address signal ADDIN1 is generated not in synchronization with a clock signal CLK (CLKINZ), redundancy judgement is performed at yet earlier timing. The latches 30b include delay circuits DELAY. The latches 30b accept the first internal address signal ADDIN1 from the input buffers 30a in synchronization with the internal clock signal CLKINZ, delay the accepted signal by the predetermined time, and output the signal as a second internal address signal ADDIN2. The delay times of the delay circuits DELAY are set so that the delay of the second internal address signal ADDIN2 to the first internal address signal ADDIN1 becomes equal to the time for the redundancy judgement circuit 28 to make an address judgement.

This embodiment can offer the same effects as those obtained from the first embodiment described above. Besides, in this embodiment, the address input circuit 30 outputs the first internal address signal ADDIN1 not in synchronization with the clock signal CLK, and outputs the second internal address signal ADDIN2 in synchronization with the clock signal CLK. Therefore, even in semiconductor memories of clock synchronous type such as an FCRAM, read operations and write operations to a memory cell or a redundancy memory cell can be controlled at high speed.

Figure 7:
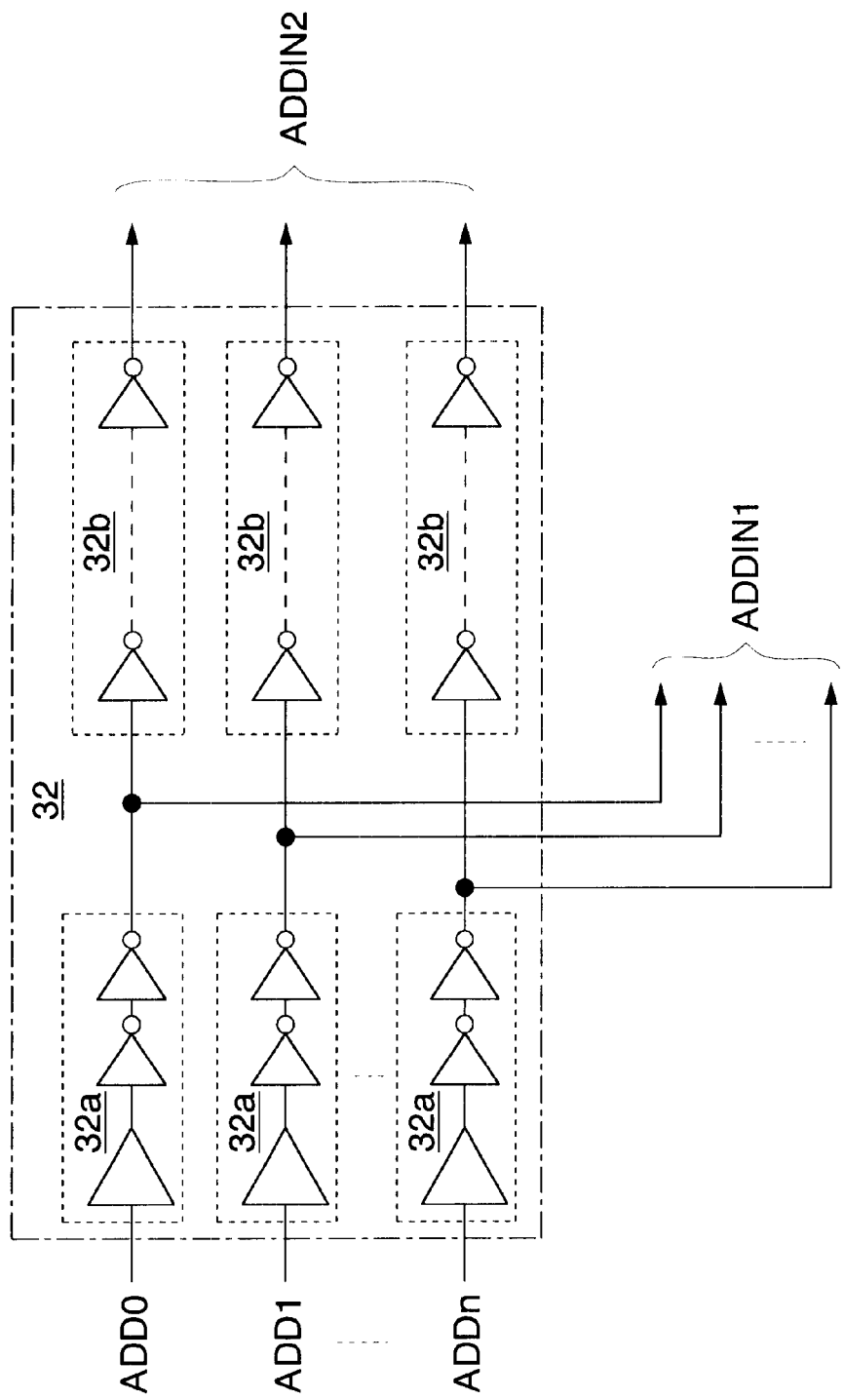
FIG. 7 is a block diagram showing the essential parts of a third embodiment of the semiconductor integrated circuit in the present invention.

FIG. 7 shows an address input circuit in a third embodiment of the semiconductor integrated circuit in the present invention. The same circuits and signals as those described in the conventional art and in the first embodiment will be designated by identical reference numbers. Detailed description thereof will be omitted.

The semiconductor integrated circuit of this embodiment is formed as an FCRAM similar to that of the first embodiment. The FCRAM has an address input circuit 32 which differs from the address input circuit 24 of the first embodiment. The configuration excepting the address input circuit 32 is substantially identical to that of the first embodiment.

The address input circuit 32 has input buffers 32a including current mirror circuits and inverters in cascade connections, and delay circuits 32b so as to correspond to address signals ADD0–ADDn. The input buffers 32a amplify the address signals ADD0–ADDn, receive the amplified signals with their inverters, and output the signals as a first internal address signal ADDIN1. The delay circuits 32b delay the first internal address signal ADDIN1 from the input buffers 32a by the predetermined time, and output the resultant as a second internal address signal ADDIN2. The delay times of the delay circuits 32b are set so that the delay of the second internal address signal ADDIN2 to the first internal address signal ADDIN1 becomes equal to the time for the redundancy judgement circuit 28 to make an address judgement. In this way, the address input circuit 32 makes operations asynchronous to a clock signal CLK. Since the first internal address signal ADDIN1 is generated not in synchronization with the clock signal CLK (CLKINZ), redundancy judgement is performed at yet earlier timing.

This embodiment can offer the same effects as those obtained from the first and second embodiments described above. Moreover, in this embodiment, the address input circuit 32 is operated not in synchronization with the clock signal CLK. Thus, the operations of those circuits subsequent to the latching circuit 26 shown in FIG. 3 can be started earlier. As a result, read operations and write operations to a memory cell or a redundancy memory cell can be controlled at yet higher speed.

Figure 8:
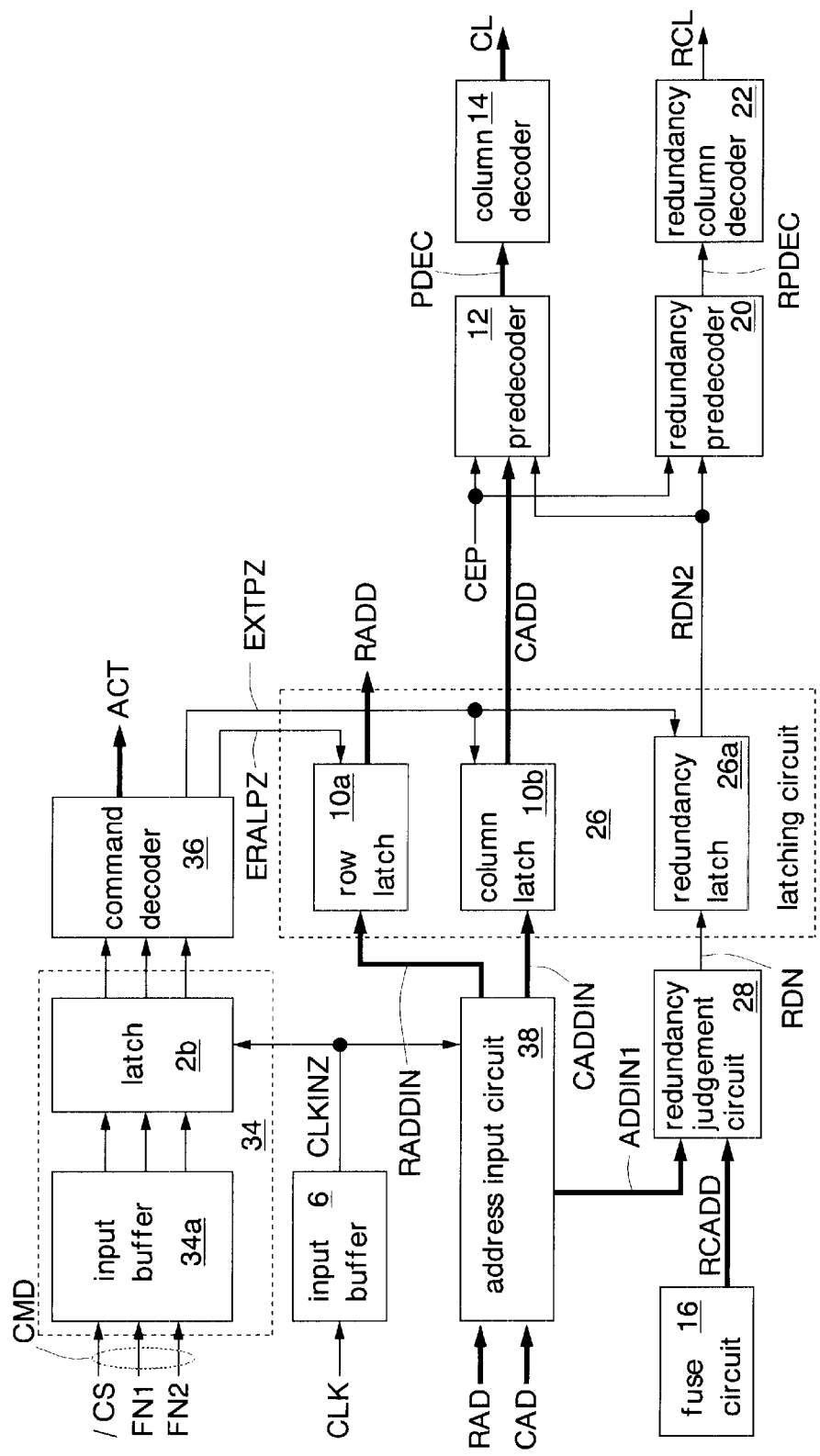
FIG. 8 is a block diagram showing a fourth embodiment of the semiconductor integrated circuit in the present invention.

FIG. 8 shows a fourth embodiment of the semiconductor integrated circuit in the present invention. The same circuits and signals as those described in the conventional art and in the first embodiment will be designated by identical reference numbers. Detailed description thereof will be omitted.

The semiconductor integrated circuit of this embodiment is formed as an FCRAM. This FCRAM has the function of receiving a row address signal RAD and a column address signal CAD from chip exterior at the same time (address non-multiplex method) and performing a read operation or a write operation.

The FCRAM has an input circuit 34, a command decoder 36, an input buffer 6, an address input circuit 38, a latching circuit 26, a predecoder 12, a column decoder 14, a fuse circuit 16, a redundancy judgement circuit 28, a redundancy predecoder 20, and a redundancy column decoder 22. The input buffer 6, latching circuit 26, predecoder 12, column decoder 14, fuse circuit 16, redundancy judgement circuit 28, redundancy predecoder 20, and redundancy column decoder 22 are identical to those of the first embodiment. The connections of these circuits are also identical.

The input circuit 34 has an input buffer 34a for receiving command signals /CS, FN1, and FN2 (these may be collectively referred to as a command signal CMD), and a latch 2b for accepting the received signals in synchronization with an internal clock signal CLKINZ. The command decoder 36 decodes the accepted command signal, and outputs a command signal ACT, an RAS address latching signal ERALPZ, a CAS address latching signal EXTPZ, and so forth depending on the decoding result.

Figure 9:
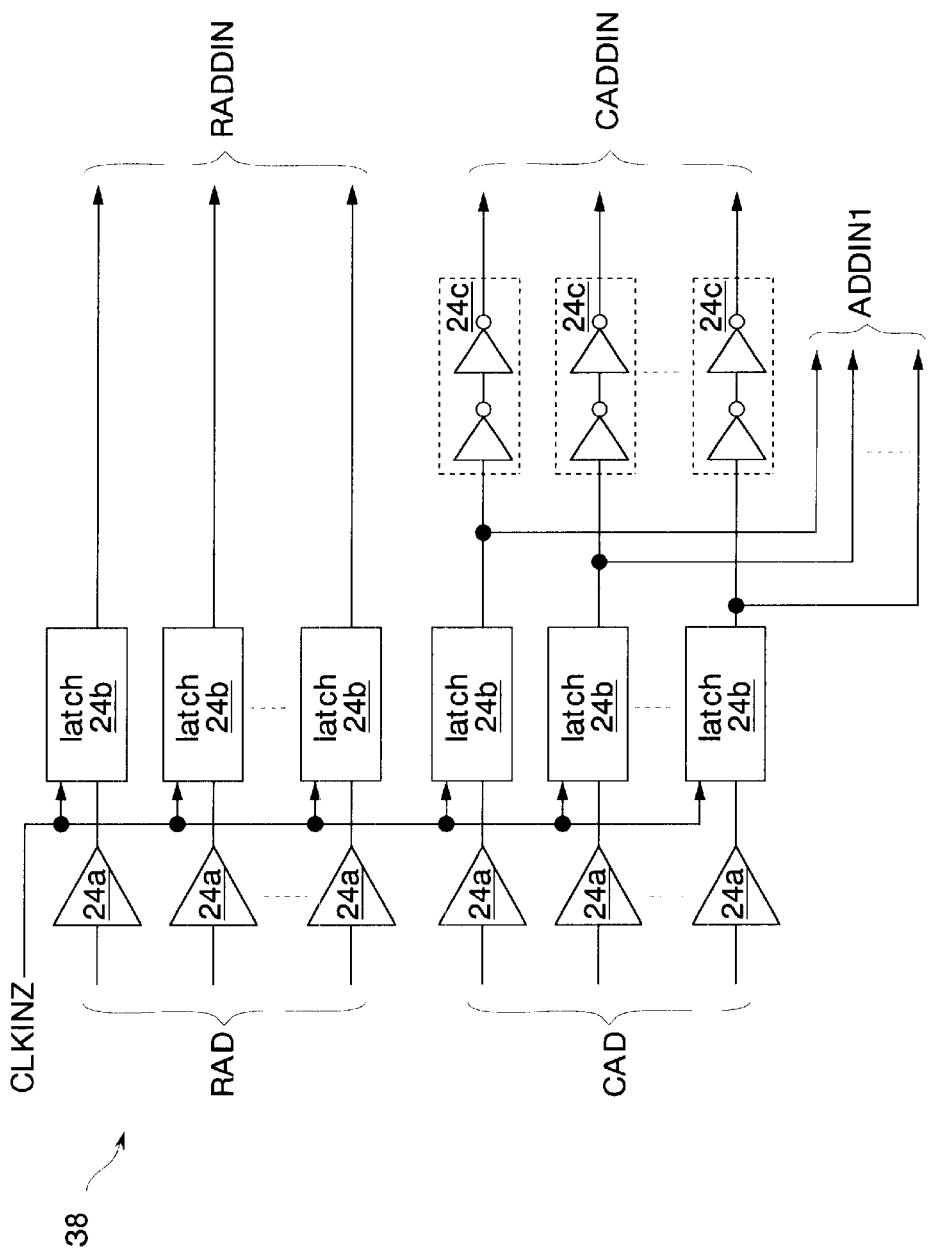
FIG. 9 is a circuit diagram showing the details of the address input circuit in FIG. 8.

FIG. 9 shows the details of the address input circuit 38.

The address input circuit 38 has input buffers 24a for receiving the row address signal RAD and the column address signal CAD, buffers 24b for accepting the received address signals in synchronization with the internal clock signal CLKINZ, and buffers 24c formed in association with the column address signal CAD. The input buffers 24, latches 24b, and buffers 24c are the same circuits as those shown in FIG. 4. The latches 24b corresponding to the row address signal RAD output the accepted signal as an internal row address signal RADDIN. The latches 24b corresponding to the column address signal CAD output the accepted signal as a first internal address signal ADDIN1. The buffers 24c receive the first internal address signal ADDIN 1, delay the received signal by predetermined time T1, and output as an internal column address signal CADDIN (second internal address signal). The time T1 is the time required for the redundancy judgement circuit 28 shown in FIG. 8 to make a redundancy judgement.

Figure 10:
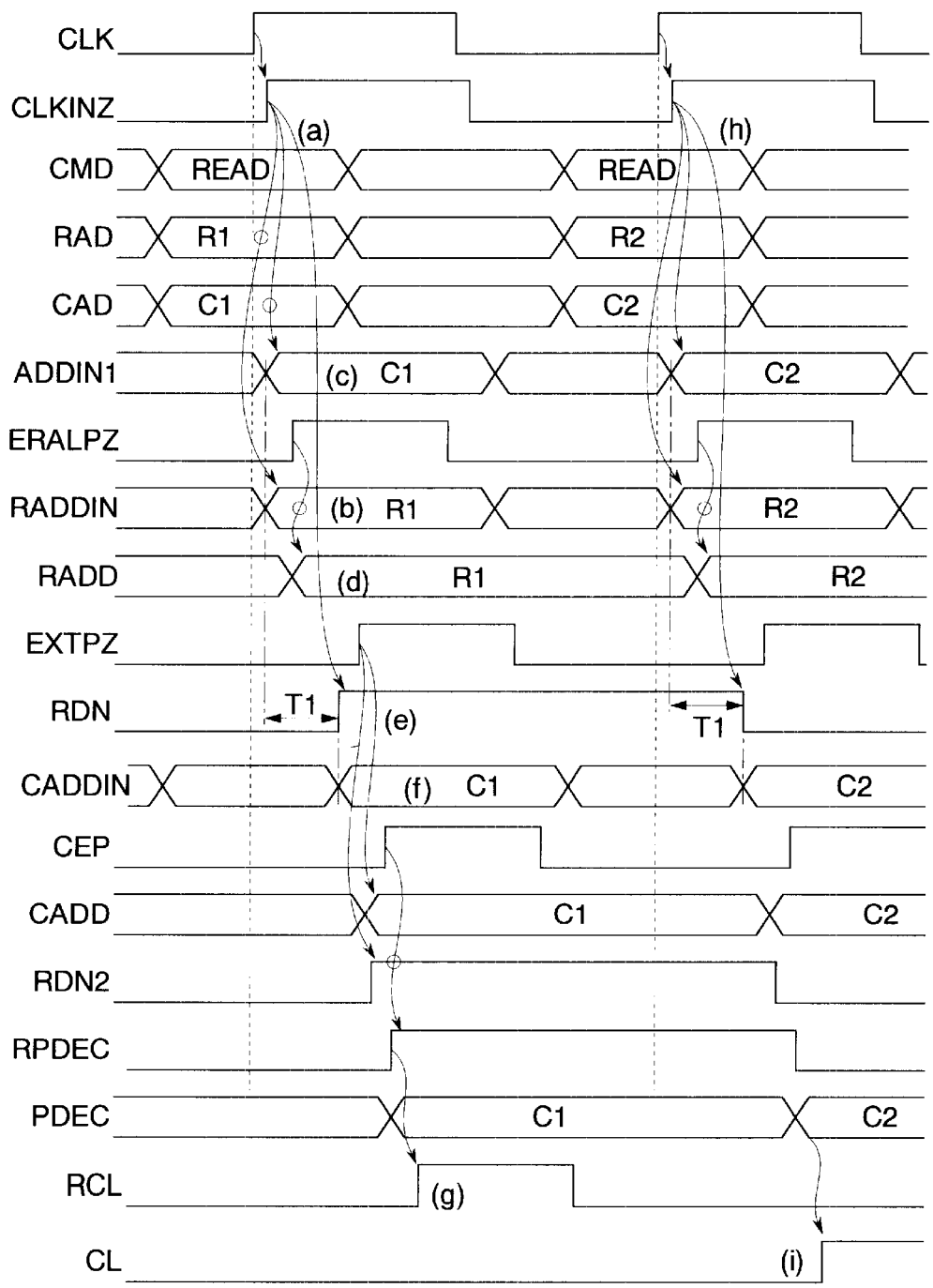
FIG. 10 is a timing chart showing the read operations of the semiconductor integrated circuit in FIG. 8.

FIG. 10 shows-an example of read operations by the FCRAM shown in FIG. 8. Here, description will be omitted of the same operations as those of the first embodiment.

Initially, a command signal CMD indicating read operation, a row address R1, and a column address C1 are supplied to the FCRAM in synchronization with a clock signal CLK (FIG. 10(a)). Here, the column address C1 is a defect address.

The address input circuit 38 accepts the row address R1 and the column address C1 in synchronization with the internal clock signal CLKINZ, and outputs the accepted signals as the internal row address signal RADDIN and the first internal address signal ADDIN1 (column address C1) (FIG. 10(b), (c)). The row latch 10a accepts the internal row address signal RADDIN in synchronization with the RAS address latching signal ERALPZ, and outputs the accepted signal as a row address signal RADD (FIG. 10(d)). internal circuits associated with row addresses receive the row address RADD, and perform the processing of selecting a predetermined word line.

The redundancy judgement circuit 28 compares the first internal address signal ADDIN1 and the redundancy column address signal RCADD, and activates (to high level) a redundancy judgement signal RDN (FIG. 10(e)). In addition, the address input circuit 38 delays the first internal address signal ADDIN1 by the time T1, and outputs this signal as the internal column address signal CADDIN (FIG. 10(f)). Subsequently, as in FIG. 5, the redundancy column line selecting signal RCL is activated to perform the read operation of data retained in the redundancy memory cell (FIG. 10(g)).

Next, a command signal CMD indicating read operation, a row address R2, and a column address C2 are supplied to the FCRAM in synchronization with the clock signal CLK (FIG. 10(h)). Here, the column address C2 is not a defect address. Subsequently, as in FIG. 5, the column line selecting signal CL is activated to perform the read operation of data retained in a normal memory cell (FIG. 10(i)).

The same effects as those of the first embodiment described above can be obtained even in the cases where the present invention is thus applied to an FCRAM of an address non-multiplex method.

The embodiments described above have dealt with the cases where the present invention is applied to a column address redundancy circuit. However, the present invention is not limited to such embodiments. For example, the present invention may be applied to row address redundancy circuits. Moreover, the present invention may be applied to both column address redundancy circuits and row address redundancy circuits.

The embodiments described above have dealt with the cases where the present invention is applied to an FCRAM. The present invention is not limited to such embodiments. For example, the present invention may be applied to semiconductor memories including other DRAMs, such as an SDRAM, and SRAMs. The present invention may also be applied to system LSIs implementing DRAM memory cores.

Moreover, the semiconductor fabrication processes to which the present invention is applied are not limited to the CMOS processes, and may be Bi-CMOS processes.

And, the invention is not limited to the above embodiments and various modifications may be made without departing from the spirit and scope of the invention. Any improvement may be made in part or all of the components.

What is claimed is:

1. A semiconductor integrated circuit comprising:

memory cells and a redundancy memory cell for relieving a defective memory cell;

an address input circuit for receiving an address signal, and outputting an internal address signal;

a latching circuit for latching said internal address signal in synchronization with an address latch signal, and supplying the internal address to an internal circuit;

a redundancy judgement circuit for receiving said internal address signal distributed from the address input circuit, judging whether said internal address signal matches a defect address of the defective memory cell, and outputting a redundancy judgement signal; and a redundancy latching circuit for latching said redundancy judgement signal in synchronization with the address latch signal, and supplying the redundancy judgement signal to said internal circuit.

2. The semiconductor integrated circuit according to claim 1, wherein:

said internal address signal output from said address input circuit includes a first internal address signal and a second internal address signal output at timing later than said first internal address signal;

said redundancy judgement circuit receives said first internal address signal as said internal address signal; and said latching circuit latches said second internal address signal as said internal address signal.

3. The semiconductor integrated circuit according to claim 2, wherein the delay time of said second internal address signal to said first internal address signal is set to the time for said redundancy judgement circuit to make a defect address judgement.

4. The semiconductor integrated circuit according to claim 3, wherein said address input circuit outputs said first internal address signal and said second internal address signal in synchronization with a clock signal.

5. The semiconductor integrated circuit according to claim 3, wherein said address input circuit outputs said first internal address signal not in synchronization with a clock signal, and outputs said second internal address signal in synchronization with said clock signal.

6. The semiconductor integrated circuit according to claim 1, wherein:

said address input circuit receives multiplexed address signals; and said redundancy judgement circuit judges whether one of said multiplexed address signals matches the defect address.

* * * * *